Sept. 29, 1970 M. M. ATALLA 3,531,698

CURRENT CONTROL IN BULK NEGATIVE CONDUCTANCE MATERIALS

Filed May 21, 1968 2 Sheets-Sheet 1

INVENTOR
MARTIN M. ATALLA
BY A. C. Smith
ATTORNEY

INVENTOR
MARTIN M. ATALLA
BY Q. C. Smith
ATTORNEY

United States Patent Office 3,531,698

Patented Sept. 29, 1970

3,531,698

CURRENT CONTROL IN BULK NEGATIVE CONDUCTANCE MATERIALS

Martin M. Atalla, Portola Valley, Calif., assignor to Hewlett-Packard Company, Palo Alto, Calif., a corporation of California

Filed May 21, 1968, Ser. No. 730,714
Int. Cl. H01l *11/00*
U.S. Cl. 317—235 4 Claims

ABSTRACT OF THE DISCLOSURE

Carrier density is controlled in a sample of bulk negative conductance material such as gallium arsenide by controlled injection of carriers into the sample in a carrier-depleted region established about a p-n rectifying junction or metal-semiconductor barrier at an end of the sample. An electric field is established across the sample by reverse biasing the junction or barrier to extend the depletion region between the end electrodes thereby removing free carriers. The resulting current flow between electrodes is now minimal and corresponds to the usual reverse leakage current through such depletion regions. Current flow in the device now can be obtained and controlled by various means. For example, by illuminating the cathode end of the device, carriers are generated and will flow through the depletion region of the device. This is current control by "optical excitation and injection." Another example is by direct electrical injection of carriers into the depletion region from another forward biased p-n junction located near the depleted region. This is current control by "electrical injection." If now the electric field in the sample exceeds a critical or threshold value beyond which the differential conductivity through the depleted region is negative, and the device is mounted in a proper resonant circuit or cavity, current oscillations at microwave frequencies are produced at a power level which is controlled by the rate of carrier injection.

BACKGROUND OF THE INVENTION

Certain known devices include a sample of material such as gallium arsenide which shows negative conductance above a critical value of applied electric field and exhibit current instability due to nucleation or formation of high-field negative conductance regions or domains which propagate along the length of the sample from one ohmic contact to another (see, for example, U.S. Pat. 3,365,583 issued on Jan. 23, 1968 to John B. Gunn). The operating characteristics of devices of this type are considered to be limited by the geometry of the sample and are not readily controllable by external circuitry.

Other known devices which include a sample of material that has bulk negative conductance above a critical value of applied electric field may be operated in a mode of limited space-charge accumulation per cycle of oscillation so that the entire sample is nearly homogeneously in either a high-field negative conductance state or in a low-field positive conductance state. Devices of this type are described in the literature (see U.S. patent application Ser. No. 514,008 filed on Dec. 15, 1965 by Martin M. Atalla, Robert J. Archer, Robert D. Hall and Reinhart W. H. Engelman). In devices of that latter type, the current conduction through the sample during negative conductivity operation is controlled by the external circuitry which controls or modulates the oscillatory signal power. All above devices are essentially two-terminal, or single port devices, and hence current flow in them cannot be controlled independently.

SUMMARY OF THE INVENTION

In the present invention, means are provided for independent control of current through such a device thereby providing a multiport device configuration. A depletion region is formed in a sample of material such as gallium arsenide which exhibits bulk negative conductivity above a critical value of applied electric field. By increasing the applied voltage on the device one observes only the usual leakage current of a reverse biased junction or barrier. This small current flow will be obtained as a direct current of negligible magnitude even if the applied field exceeds the critical value for which the device exhibits negative conductance. The device thus behaves like an insulator that is depleted of carriers. Now if carriers are injected into the device by means of optical, electrical, or electron beam means, the carrier concentration in the device can be independently controlled by such means. Furthermore if the device is biased past the threshold field into its negative conductance range, current oscillation at microwave frequencies are obtained as determined by the resonant circuit used and by the magnitude of the rate of injected carriers.

DESCRIPTION OF THE DRAWING

FIGS. 6(*b*) through (*i*) are a sequence of charts showing the variations with time of the electron density through a device of length less than $\lambda$, according to the present invention.

DESCRIPTION OF THE PREFERRED EMBODIMENT

General description

Figure 1:
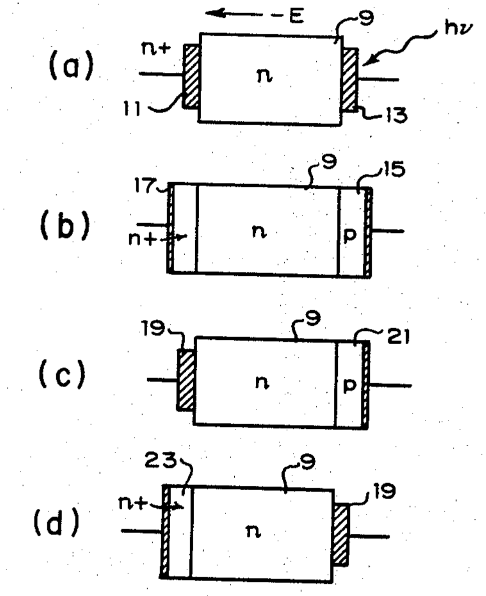
FIGS. 1(*a*) through (*d*) are simplified sectional views of devices according to the present invention.
Figure 2:
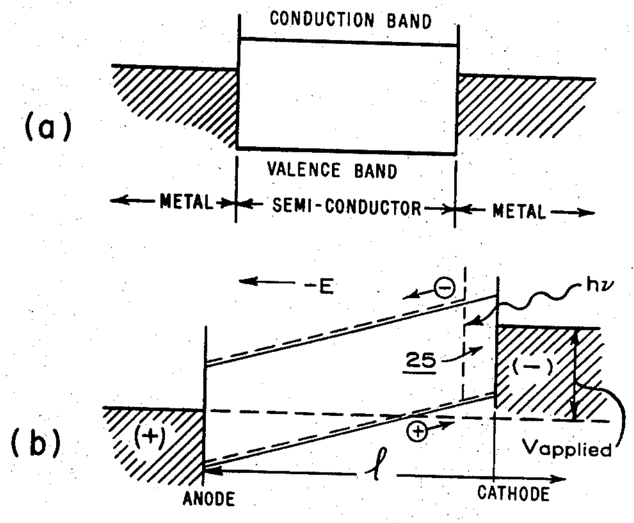
FIGS. 2(*a*) and (*b*) are graphs of the band-gap topology of a device according to FIG. 1.

Referring now to FIG. 1 and to the graphs of FIGS. 2(*a*) and (*b*), four simplified embodiments of a device according to the present invention and its operating characteristics are shown. In the embodiment of FIG. 1(*a*), the device includes a sample 9 of semiconductor material, typically n-type gallium arsenide, which exhibits negative conductivity above a selected value of applied electric field E. The sample has deposited on it two electrodes 11, 13 formed from metals such as nickel, molybdenum, chrome, gold, platinum, aluminum, or the like, to provide Schottky barriers at the ends of the sample 9. The sample 9 is lightly doped with n-type impurities and has a resistivity typically greater than 10 ohm-centimeters corresponding to free carrier concentrations of about $10^{14}$ or less. The depletion regions formed about the metal-semiconductor boundaries 9–11 and 9–13 are essentially free of carriers and may be widened to include the entire length of the sample 9 by the application of bias voltage across the electrodes. The resulting electric field in the sample 9 may vary through and beyond the critical field value above which the sample material exhibits negative conductivity (typically, 3000 volts per centimeter for gallium arsenide)

without producing a current through the sample appreciably larger than the reverse leakage current through a depletion region in such material (typically less than one microamp). Larger values of applied electric field which may normally establish bulk negative conductivity in the sample material only produce current in the sample 9 which is similar to current flow in a back-biased diode and is related to reverse leakage through the depletion region. The sample 9 may therefore be stably biased at values of applied electric field at which the sample material normally shows negative conductivity but without conducting the high values of current which would normally be associated with such values of electric field and which would only be limitable by external circuitry. Rather, current conduction through the sample 9 under such conditions of applied electric field is controlled according to the present invention by the injection of carriers into the depletion region formed in the sample. Techniques for introducing carriers into the depletion region in the sample 9 are described later herein.

It should be apparent that other means for establishing depletion regions in the sample 9 may be used. FIG. 1(*a*), for example, shows a symmetrical structure with two Schottky barriers 9–11 and 9–13. An alternative structure is shown in FIG. 1(*d*) where only one Schottky barrier 9–19 is placed at the cathode and an ohmic contact n–n+ 9–23 is placed at the other or anode end of the device. FIG. 1(*b*) shows a third alternative where the cathode has a rectifying p-n junction 9–21 and an ohmic contact n–n+ at the anode. FIG. 1(*c*) is the same as 1(*b*) except for having a Schottky barrier 9–19 at the anode. In each embodiment, the injection of carriers into the depletion region produced within the sample 9 determines and controls the current flow through the sample and the injected carriers are collected by a non-injecting electrode at a location on the sample which is disposed away from the injection location.

Referring to the graph of FIG. 2(*a*), the band-gap topology is shown for an unbiased device of a type similar to the one shown in FIG. 1(*a*) which has Schottky-barrier electrodes at the ends of the sample. Upon application of a biasing voltage $V_{applied}$ across the end electrodes, as shown in FIG. 2(*b*), little current, typically less than a microamp, flows through the depletion region in the semiconductor sample. This current is analogous to current flow through a reverse biased diode and is believed to be due primarily to thermally agitated free carriers in the depletion region. This condition of low current flow exists even for values of applied electric field which bias the sample material into its bulk negative conductance region. However, under these electric field conditions, the current through the sample may be controlled by illuminating the cathode end of the sample, as shown in FIG. 2(*b*), to generate free electron-hole pairs. The generated free electrons travel away from the cathode through the sample at the drift velocity $\nu_d$ of the semiconductor material ($\nu_d$ for GaAs$\approx 2\times 10^7$ cm./sec.) under the influence of the electric field $E=Va/L$. The holes, however, (which, in material like GaAs, do not exhibit negative conductance) are readily collected at the cathode and, hence, contribute no lossy effects which they could produce if the sample was illuminated and absorbed light elsewhere than at the cathode. Accordingly, it is desirable to have the incident light energy $h\gamma$ all absorbed in as narrow a region 25 close to the cathode as possible. The light wavelength should therefore be shorter than about 0.8 micron for control of carrier injection in gallium arsenide samples. The intensity of the incident light energy $h\gamma$ thus determines the rate of free electrons injected into the depletion region of the sample and hence may be used to control or modulate the current conducted by the sample. Free carrier electrons may also be injected into the depletion region of the sample by bombarding the cathode end of the sample with an electron beam using a suitable structure which enables the beam intensity to be varied for varying the carrier concentration in the depletion region of the sample. Modulating the electron beam intensity or energy thus varies the current conducted by the sample.

Figure 3:
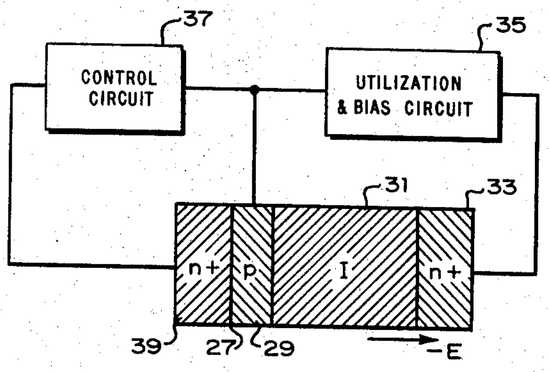
FIG. 3 is a simplified sectional view of an electrically controllable device according to the present invention.

Other techniques for controlling injection of carriers into the depletion region of the sample may also be used. For example, the high-resistivity sample of bulk negative conductance material (resistivity typically greater than 10 ohm-centimeters) may form an I-region in a three-terminal N+–P–I–N+ structure, as shown in FIG. 3. Injection of carriers into the I-layer depletion region may thus be controlled by altering the forward bias at then n+p junction 27. The P- and I-layers 29–31 form a reverse biased rectifying junction and carriers injected through the relatively thin P-layer 29 into the I-layer 31 thus travel through the depleted I-layer 31 at the drift velocity $\nu_d$ of the material and are collected by a non-injecting electrode such as the N+-layer 33 at the end of the sample. The motion of the electrons through the I-layer produces current flow in the external circuit 35 which is thus controlled by bias voltage supplied across n+p junction 27 by the control circuit 37 connected between the P-layer 29 and the N+-layer 39.

This device and the devices described in connection with FIGS. 1(*a*), (*b*), (*c*) and (*d*) are shown in elongated configurations for clarity but it should be understood that devices according to the present invention may also be formed in flat or planar configurations for lateral flow of electrons between electrodes disposed on or near the same surface of the sample.

THEORY OF OPERATION

Figure 4:
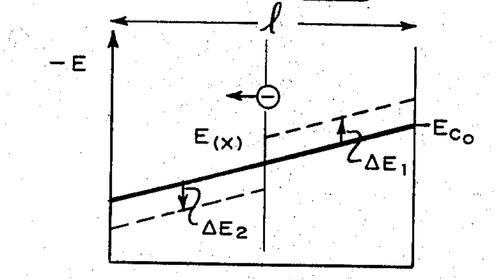
FIG. 4 is a graph showing an arbitrary field distribution through a device according to the present invention.

The motion of an electron through the depletion region under the influence of an arbitrary field distribution may be described in connection with the graph of FIG. 4. Consider an electron in transit in a plane which is normal to the electric field produced by a constant voltage $V_a$ applied across the sample and which is at a position $\chi$ in the sample. The electron produces changes in the electric field $\Delta E_1$ and $\Delta E_2$ which are constant in the regions to the left and right of the plane. By Gauss' theorem:

$$K(\Delta E_1+\Delta E_2)=4\pi q \qquad (1)$$

and since the voltage $V_a$ is constant:

$$\Delta E_1\chi=\Delta E_2(L-\chi) \qquad (2)$$

Combining Equations 1 and 2:

$$\frac{4\pi}{K}q\chi=L\left(\frac{4\pi}{K}q-\Delta E_1\right) \qquad (3)$$

In time $dt$, the electron moves $d\chi=\nu_d dt$, where $\nu_d$ is electron drift velocity in the sample material. Thus, from Equation 3

$$\frac{d\Delta E_1}{dt}=\frac{4\pi}{K}q\frac{\nu d}{L} \qquad (4)$$

The electric field at the cathode is $E_{c0}+\Delta E_1$ and the cathode current associated with an external circuit for movement of one electron and for movement of many electrons through the depletion region are, respectively:

$$i=q\frac{\nu_d}{L} \qquad (5)$$

$$i=\frac{q}{L}\int_0^L n\nu_d d\chi \qquad (6)$$

The instantaneous current for any configuration or system may thus be calculated for a change in applied voltage $dV_a$ which produces a change $dV_a/L$ in the electric field through the sample. Thus:

$$di=\frac{q}{L}\frac{d\nu_d}{dE}dE \qquad (7)$$

and the differential conductance of the sample may be calculated:

$$\frac{di}{dV_a}=\frac{q}{L}\int_0^L \mu_{diff} n d\chi \quad (8)$$

where $\mu_{diff}$ is the differential mobility of the electrons and $n$ is the density of the electrons. From this it should be noted that for a negative $\mu_{diff}$ as for gallium arsenide biased above a critical value of electric field the sample exhibits negative conductance. Furthermore, its magnitude of the negative conductance is controlled by the number of injected electrons and may thus be used to generate sustained microwave oscillations.

Figure 5:
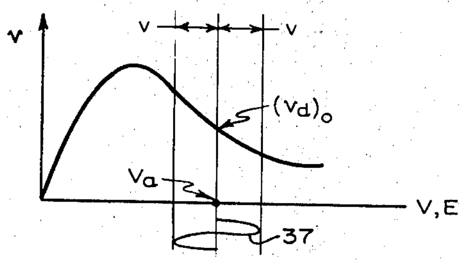
FIG. 5 is a graph of the carrier mobility as a function of electric field in a device according to the present invention.

Assume now that the device is quiescently biased by an applied voltage $V_a$ which establishes an electric field in the sample for which the sample shows negative conductance and that an R.F. signal of sinusoidal waveform is superimposed on the biasing voltage $V_a$, as shown in the graph of FIG. 5. For a constant rate of electron injection, the boundary condition at the cathode is:

$$j_{inj}=qn_c\nu_d \quad (9)$$

The product of $n\cdot\nu_d$ at the cathode is independent of time so that the density of electrons at the cathode must change with time through variations in $\nu_d$ with applied voltage. However, since $\nu_d$ is instantaneously the same at all values of $\chi$ through the sample (here as a first approximation the space-charge effects of the injected electrons are neglected) the variations of $n$ with time at any point $\chi$ in the sample will be the same as at the cathode but delayed in time and hence at a different phase. Thus, a traveling wave appears to travel away from the cathode in the direction of electron movement with a velocity that is modulated at the R.F. frequency of the superimposed signal. Thus, from FIG. 5, it can be shown, for an R.F. signal 37 which alters the electric field in the sample only between the values for which the sample shows negative conductance, that the distance $\lambda$ an electron travels through the sample in one period of the R.F. signal is:

$$\lambda=\frac{2\pi}{\omega}(\nu_d)_0 \quad (10)$$

where $(\nu_d)_0$ is the drift velocity corresponding to the D.C. bias, and the instaneous drift velocity $\nu_d$ is given by:

$$\nu_d=(\nu_d)_0-\mu_{diff}\cdot\frac{V}{L}\sin \omega t \quad (11)$$

where $V/L$ is the peak R.F. field amplitude. The electron density at the cathode from Equations 9, 10 and 11 at time $t$ is:

$$n_c=\frac{j_{inj}}{q\nu_d}=\frac{j_{inj}}{q\left[(\nu_d)_0-\mu_{diff}\cdot\frac{V}{L}\sin \omega t\right]} \quad (12)$$

At some later time $t_1$, the electron density at the cathode will be:

$$n(t_1)=\frac{j_{inj}}{q\left[(\nu_d)_0-\mu_{diff}\cdot\frac{V}{L}\sin \omega t_1\right]} \quad (13)$$

and the original electron density at the cathode at time $t$ will appear at location $\chi$ at a later time $t_1$. So, it can be shown that:

$$\chi(t_1)=(\nu_d)_0\left(\frac{2\pi}{\omega}=t_1\right)+\mu_{diff}\cdot\frac{V}{L}\cdot\frac{1}{\omega}(1-\cos \omega t_1) \quad (14)$$

Figures 6, 7:
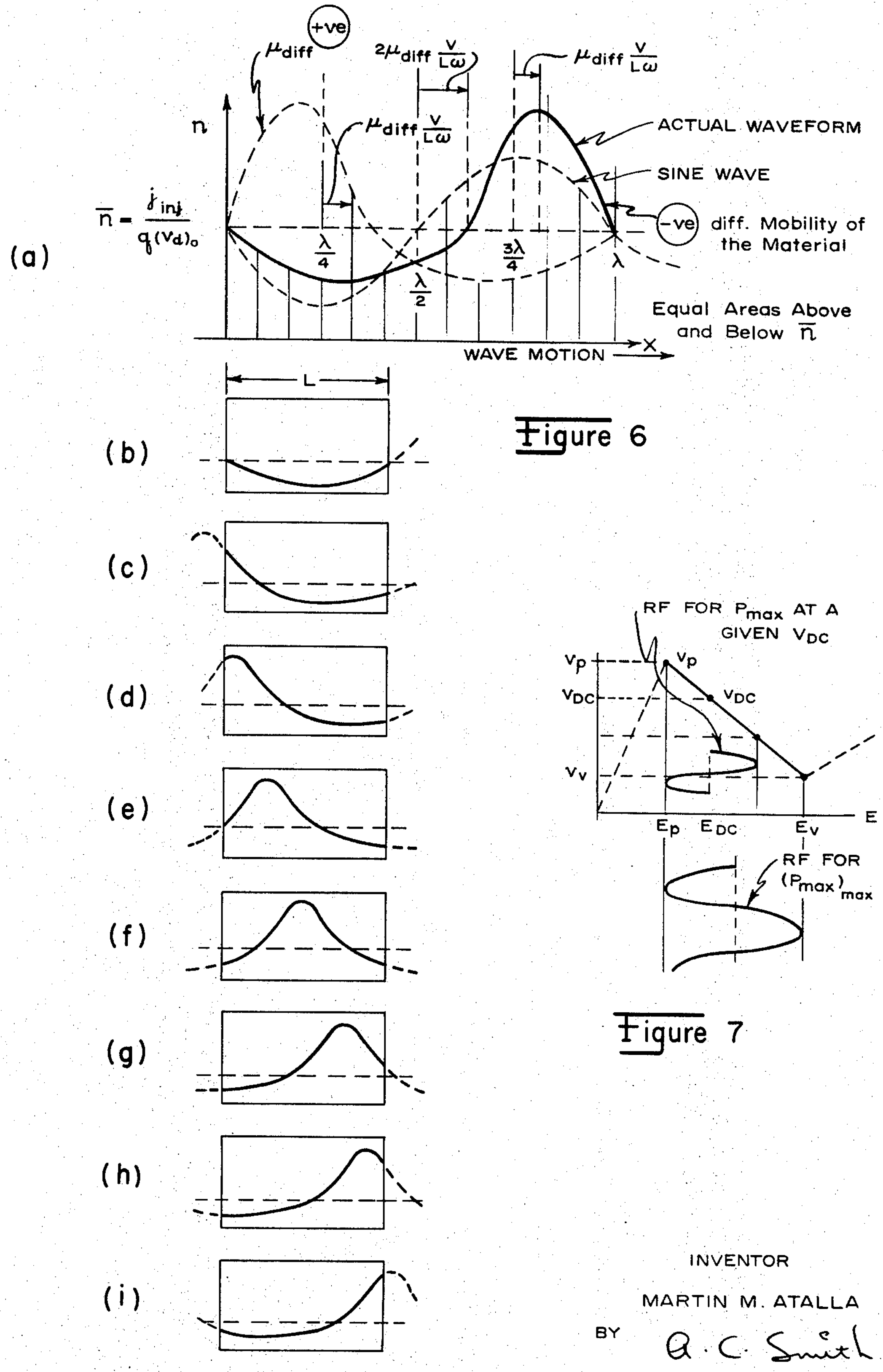
FIG. 6(*a*) is a chart of electron density through a device of length $\lambda$, a ccording to the present invention.
FIG. 7 is a simplified graph of carrier mobility as a function of electric field in a device according to the present invention.

The Equations 13 and 14 may be plotted at various times $t_1$ and locations $\chi$ to yield the waveform of the electron density distribution within a wavelength $\lambda$ as shown schematically in FIG. 6($a$). FIGS. 6($b$) through ($i$) show a time sequence of charts of electron density distribution in a device of length L less than the wavelength $\lambda$. The density of electrons at each selected location in the sample varies with time about a median value $\overline{n}$ which is given by:

$$n=\frac{j_{inj}}{q(\nu_d)_0} \quad (15)$$

and that the waveform of electron density through the sample at each instant of time moves in the direction of electron flow away from the cathode. Thus, it can be shown that for a sample of length L=$\lambda$, as shown in FIG. 6($a$), the total number of electrons in the sample remains constant with time. For samples of length not equal to $\lambda$ or equal to multiples of $\lambda$, however, the total number of electrons in the sample fluctuates with time and the instantaneous total is the product of the electron injection rate and the transit time $\Delta t$ for a sample of length L. Thus, it can be shown that:

$$\sum_L n=\frac{j_{inj}}{q}(\Delta t)|\chi=L \quad (16)$$

The instantaneous total number of electrons in a sample as a function of time may thus be derived from Equation 16 and, from this total number, the external circuit current due to electron transit through the sample (from Equation 6 is:

$$i=\frac{q}{L}\int_{\chi=0}^{\chi=L} n\nu_d d\chi=\frac{q}{L}\cdot\nu_d\cdot\int_0^L n d\chi \quad (17)$$

Additionally, the capacitive displacement current which is related to the rate of change of the applied voltage is:

$$\frac{K}{4\pi L}\cdot\frac{dV}{dt}=\frac{K}{4\pi L}\cdot v\omega\cos \omega t \quad (18)$$

The total circuit current may thus be shown to be:

$$i=\frac{q}{L}\left[\int_0^L n d\chi\right]\cdot\left[(\nu_d)_0-\mu_{diff}\cdot\frac{V}{L}\sin \omega t\right]+\frac{K}{4\pi}\cdot\frac{v\omega}{L}\cos \omega t \quad (19)$$

which is now calculable for any sample length L. It should be noted from Equation 19 that the external circuit current includes an R.F. component (corresponding to the $$-\mu_{diff}\cdot\frac{V}{L}\cdot\sin \omega t$$

term of the equation) which is 180° out of phase (as indicated by the negative sign) with the R.F. voltage.

A device according to the present invention which is biased to a value of electric field for which the sample material shows bulk negative conductance thus exhibits an R.F. negative conductance which is equivalent to the bulk negative conductance of a material that has uniform carrier concentration approximately equal to the average injected carrier density $$\overline{n}=\frac{j_{inj}}{q(\nu_d)_0}$$

Also, the carrier density in the device (and hence current in the external circuit) is controlled by the carrier injection ($j_{inj}$) as well as by the D.C. biasing condition. Devices of this type may thus be used as active elements in high frequency generators, amplifiers, oscillators, modulators, high speed pulse circuitry, and the like, where the power of resultant signal derived from a device of this type connected in a suitable circuit is controlled by the carrier injection rate. Thus, referring to the graph of FIG. 7 which shows a simplified carrier mobility vs. electric field characteristic curve, it can be shown that for a given D.C. bias which establishes an electric field $E_{dc}$, the power output will be:

$$(P_{out})_{RF}=\frac{1}{2}\cdot V_{RF}^2\cdot(A\cdot j_{inj})\cdot\frac{\mu_{diff}}{(\nu_{DC})^2}\cdot f_{RF} \quad (20)$$

and that the output power available for this given bias condition corresponds to an R.F. peak amplitude $V_{RF}$ $$V_{RF} \equiv \nu_p - \nu_{DO} \quad (21)$$

where $$V_{DC} \leqq \tfrac{1}{2}(V_p + V_V) \quad (22)$$

Also, it can be shown that the maximum R.F. signal power which can be derived from the present device is obtained when the amplitude of the R.F. signal $V_{RF}$ is:

$$V_{RF} \equiv \tfrac{1}{2}(\nu_p - \nu_V) \quad (23)$$

for $$E_{DC} = \tfrac{1}{2}(V_v - E_p) \quad (24)$$

and the maximum R.F. power output can then be shown to be:

$$P_{RF_{max}} = \frac{1}{2}(A \cdot j_{inj}) \cdot \frac{1}{\mu_{diff} \cdot f_{RF}} \cdot \frac{1}{4}(\nu_p - \nu_v)^2 \quad (25)$$

The above indicates that for gallium arsenide, a power conversion efficiency of at least 20% is obtained from D.C. to microwave frequencies and is typically obtainable from relatively low frequencies (less than 1.0 gHz.) to higher frequencies well into the 100 gHz. range. In the above equations, A is the cross-section area.

Also, it should be noted from Equations 20 and 25 that the R.F. power output from the device for given electric field conditions may be increased nearly proportionately by increasing the length of the sample so that for a given frequency $\lambda$ is very much smaller than sample length. The device of such sample length may then be operated with substantially uniform operative characteristics over a wide range of frequencies.

The above analysis is based upon the assumption that electron travel through the sample is determined only by the applied field and that the effect of the space charge associated with a traveling electron is negligible. It appears that this simplification is reasonably accurate for small signal operation but that electron waves in transit through the sample may exibit build-up during large signal operation. This is manifested by an electron wave which originates at the cathode and which builds up for one full transit time as the electrons move through the sample away from the cathode. This build-up will thus be insignificant if the transit time is much less than the negative conductance dielectric relaxation time. Thus $$t_{transit} < \tau \quad (26)$$

$$\frac{L}{\nu_{dc}} < \frac{K}{4\pi q \mu \bar{n}} \cdot \frac{1}{9 \times 10^{11}} \quad (27)$$

This establishes an upper limit on input power for preventing build-up of space charge. For a gallium arsenide sample operating under signal conditions which are entirely within the negative conductance region, this upper limit can be shown to be about 500 watts per square centimeter. Excessive space-charge build-up may also be avoided by operating under signal conditions which extend into the regions of positive conductance.

Space-charge build-up may be useful in certain applications and may even be enhanced by providing a selected profile of the gradient of impurity concentration through the sample (heretofore considered to have uniform impurity concentration throughout for simplicity). This build-up or bunching effect may thus be used for pulse shaping. An applied pulse of slow rise time may thus be sharpened as it is compressed in pulse width by the differential mobility of electrons in the front side and back side of a wave traveling through the sample. Also the geometry of the sample, i.e. variations in cross-section along sample length, may be utilized for controlled pulse shaping and forming.

I claim:

1. Signal translating apparatus comprising:

a body of semiconductive material having first and second contiguous regions of dissimilar conductivity characteristics forming a first rectifying barrier therebetween, at least said first region exhibiting differential carrier mobility that decreases with increase in electric field for values of electric field in excess of threshold value;

collector means connected to said first region at a location which is disposed away from the first rectifying barrier;

circuit means connected between the second region and the collector means of said first region for applying electric signal to form in said first region a depletion layer that is substantially depleted of carriers and to establish in said depletion layer an electric field in excess of said threshold value;

a third region of said body contiguous to the second region having conductivity characteristics different from said second region and forming a second rectifying barrier therebetween;

means coupled to said second and third regions for selectively altering forward bias on the second rectifying barrier to control the rate of injection of majority carriers into the depletion layer substantially independent of the electric field in said depletion layer; and a utilization circuit operatively coupled to said body.

2. Signal translating apparatus as in claim 1 wherein: said collector means forms a metal-semiconductor rectifying barrier with said first region which is forward biased by the circuit means.

3. Signal translating apparatus as in claim 1 wherein: said first rectifying barrier is formed between the first and second contiguous regions of semiconductor material of complementary conductivity types and is reverse biased by said circuit means to form said depletion layer in the first region.

4. Signal translating apparatus as in claim 1 wherein: said first region of said body is n-type gallium arsenide and said second region is p-type semiconductor material.

References Cited

UNITED STATES PATENTS

| | | | |
|---|---|---|---|
| 3,439,290 | 4/1969 | Shinoda | 331—107 |
| 3,435,307 | 3/1969 | Landaver | 317—235 |
| 3,365,583 | 1/1968 | Gunn | 307—205 |

OTHER REFERENCES

IEEE Trans. On Elec. Devices, "Evaluation of Metal-Semiconductor Contacts In Bulk Ga As Oscillators by the Photovoltaic Effect," by Hayoshi et al. January 1966, pp. 200–201.

Kroemer, "Theory of the Gunn Effect," Proc. IEEE, vol. 52, p. 1736, December 1964.

McCumber, "Physics of the Gunn Effect and Its Relevance to Devices," NEREM Record, pp. 76–7, Nov. 3, 1965.

Morgan, "Electrical Shock Wave Device," IBM Tech. Disc. Bulletin, vol. 8, No. 9, p. 1302, February 1966.

Copeland, "Characterization of Bulk Negative Resistance Diode Behavior," IEEE Trans-Electron Devices, vol. Ed.–14, No. 9, pp. 461–3, September 1967

JERRY D. CRAIG, Primary Examiner

U.S. Cl. X.R.

307—299; 331—107

UNITED STATES PATENT OFFICE
CERTIFICATE OF CORRECTION

Patent No. 3,531,698 Dated September 29, 1970

Inventor(s) M. M. Atalla

It is certified that error appears in the above-identified patent and that said Letters Patent are hereby corrected as shown below:

Column 3, line 58, " $\approx$ " should read -- $\lessapprox$ --;

Column 3, line 59, $E = Va/L$ should read $E = V_a/L$

Column 4, line 14, "then" should read -- the --;

Column 4, Equation (4), that portion of the equation reading " $\frac{\nu d}{L}$ " should read -- $\frac{\nu_d}{L}$ --;

Column 6, lines 24-25, " (from Equation 6 is: " should read -- [from Equation (6)] is: --;

Column 7, Equation (21), that portion of the equation reading " $\nu_{DO}$ " should read -- $\nu_{DC}$ --;

Column 7, Equation (24), that portion of the equation reading " $V_v$ " should read -- $E_v$ --.

SIGNED AND SEALED
JAN 26 1971

(SEAL)
Attest:

Edward M. Fletcher, Jr.
Attesting Officer

WILLIAM E. SCHUYLER, JR.
Commissioner of Patents